Sept. 1, 1959 C. J. BUSANOVICH 2,902,529
THERMOELECTRIC MATERIALS AND ELEMENTS UTILIZING THEM
Filed Sept. 11, 1956
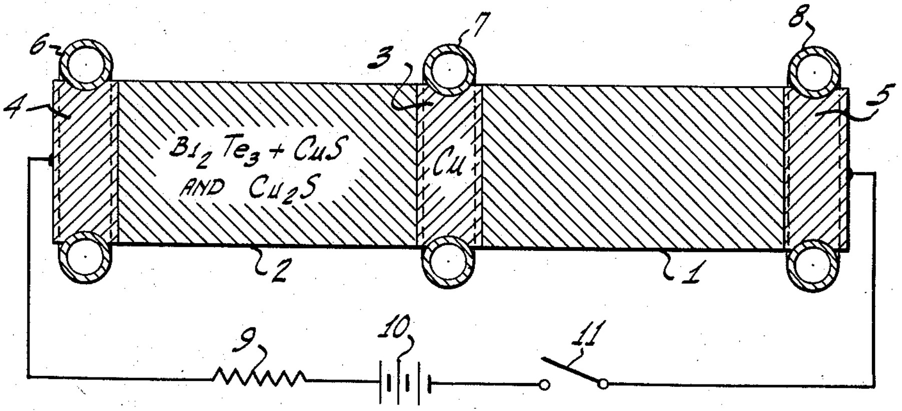
INVENTOR.
CHARLES J. BUSANOVICH
BY J. C. Whittaker
ATTORNEY 2,902,529
Patented Sept. 1, 1959

2,902,529

THERMOELECTRIC MATERIALS AND ELEMENTS UTILIZING THEM

Charles J. Busanovich, Princeton, N.J., assignor to Radio Corporation of America, a corporation of Delaware Application September 11, 1956, Serial No. 609,255

19 Claims. (Cl. 136—5)

This invention relates to improved thermoelectric materials and elements. More particularly, the invention relates to alloys useful in thermoelectric devices comprising single or multiple junctions between different metals. Such elements, when used as part of an electric circuit generate an electric current when the junction has a temperature different from the rest of the circuit; or they generate heat or cold at the junction when a current in one or the other direction is passed through the circuit.

When two elements of dissimilar metals are joined, a thermoelectric junction is formed between the ends of each element so joined. In general at least one additional junction is desired and necessary. If the elements thus joined are connected in a circuit as by a wire connecting their unjoined ends so as to form a continuous loop, a second thermoelectric junction is established between the respective ends so joined. Other junctions may be formed in other locations in the elements. If now two of the junctions are at different temperatures with respect to each other, an electro-motive force will be set up in the circuit thus formed. This effect is called the thermoelectric or Seebeck effect and the device is called a thermo-couple. Many arrangements of the elements are possible; for example, the electro-motive force may be read as a function of the temperature difference by connecting a galvanometer series-wise in the circuit. This is called a thermo-couple thermometer. Another arrangement permits the generation of electric current for operating equipment such as radio receivers or remote telephone equipment or the like utilizing the energies of the sun's rays. Such an arrangement, termed a solar generator, employs the sun's rays to heat one of the junctions to a different temperature than that of the other junction. Alternatively, the opposite effect, that is a temperature increase and decrease, may be achieved at each junction respectively by passing a current through the junctions. This is termed the Peltier effect.

The first requirement for thermoelectric devices is a high E.M.F. per degree difference in temperature between junctions. This is referred to as the thermoelectric power of the material. The second requirement is that the thermoelectric material have a low heat conductivity since a sharp temperature gradient between adjacent junctions would be difficult to maintain if the material between junctions is a good heat conductor.

The third requirement for a good thermoelectric material is high electrical conductivity or, conversely, low electrical resistivity. This is apparent since the temperature difference between junctions will not be great if the current passing through generates Joulean heat. In addition to the desirable thermoelectric properties just described, the materials or alloys should be easy to work or prepare. Many of the thermoelectric materials of the prior art are relatively weak physically, being friable and fragile much in the manner of blackboard chalk crayons. Further, many of these materials comprise relatively complicated phase systems and are difficult to control uniformly when they are cooled from their melting temperatures.

The first two factors (high thermal E.M.F. and low heat conductivity) are tied together in the Wiedemann-Franz-Lorenz (W.F.L.) relationship which states that:

$$\frac{K}{\sigma T}=L\text{(a constant)}$$

where $K$=thermal conductivity, $\sigma$=electrical conductivity, and $T$=absolute temperature. The ideal value of L is $2.45\times10^{-8}$ volts 2/° C. The nearer a material approaches the ideal W.-F.-L. number and the higher the thermal E.M.F., the better its thermoelectric properties; that is, the highest possible E.M.F. is obtained simultaneously with the lowest possible heat conductivity.

One object of the instant invention is to provide improved thermoelectric material and elements of greater thermoelectric powers than heretofore obtainable.

Another object is to provide improved thermoelectric alloys which may be readily and easily prepared and having a greater effective thermoelectric power than heretofore obtainable.

Another object of the invention is to provide improved thermoelectric devices capable of producing a greater reduction in temperature than heretofore possible.

The instant invention provides improved thermoelectric materials having thermoelectric properties significantly better than the thermoelectric properties of the best previously known materials. In addition, the materials of the invention are relatively simple to prepare forming stable systems immediately upon solidifying from a melt. The compositions according to the invention fall within the following range: bismuth telluride alloyed with up to 1.64 wgt. percent of one or more of the sulfides or selenides of copper or silver.

The invention will be described in greater detail by reference to the accompanying drawing of which the single figure is a schematic, cross-sectional, elevational view of a thermoelectric element according to the invention.

Thermoelectric materials are classified as either N-type or P-type depending upon the direction of current flow across the cold junction formed by the thermoelectric metal and another metal when operating as a thermoelectric generator according to the Seebeck effect. If the positive current direction at the cold junction is from the thermoelectric metal, then it is termed a P-type thermoelectric material. Conversely, if the positive current direction is from cold junction and toward the thermoelectric metal, it is termed an N-type thermoelectric material. The present invention relates to an improved N-type thermoelectric element.

Referring to the drawing, the element shown is composed of two thermoelectrically different members 1 and 2 which are conductively joined by an intermediate conductive part 3 of negligible thermoelectric power. The P-type thermoelectric member 1 may consist of an alloy of 17–32 mol. percent bismuth, 55–65 mol. percent tellurium, and 8–23 mol. percent antimony, plus at least 0–0.56 wgt. percent of silver, mercury or gold and at least 0–1.7 wgt. percent of selenium and sulfur. These wgt. percentages are based on the total weight of the tellurium, bismuth and antimony. A preferred P-type alloy consists of 60 mol. percent tellurium, 20 mol. percent bismuth, 20 mol. percent antimony, 0.28 wgt. percent silver and 0.56 wgt. percent selenium. This alloy is preferred for the P-type element because in addition to having thermoelectric properties fully comparable to the thermoelectric properties of the best known P-type materials, the alloy is relatively simple to prepare and forms a stable system immediately upon freezing. This P-type alloy has a thermal E.M.F. of +140 microvolts/° C. and a resistivity of about 0.0005 ohm-cm. It should be understood that other P-type thermoelectric materials may be employed as desired.

The member 2 consists of an N-type thermoelectric material according to the invention. This material comprises an alloy consisting of $Bi_2Te_3$ with up to 1.64 wgt. percent of one or more of the sulfides or selenides of copper or silver. The intermediate part 3 which connects the differential members 1 and 2 to form a thermoelectric junction between them consists preferably of copper. It serves as a cooling terminal for the removal of heat from a medium and may be contacted by a pipe coil 7 to conduct a fluid coolant to a distant location. Alternatively, the member 3 may be shaped as a thin vane or other structure for cooling in its immediate environment.

An energizing circuit comprising a current source 10, a resistor 9, and a control switch 11 is connected to the element by copper end terminals 4 and 5. The end terminals are provided with single turn pipe coils 6 and 8 through which a heat transporting fluid may be pumped to maintain them at a relatively constant temperature. Thus when the action of the current through the thermoelectric junction produces a temperature differential between the intermediate terminal 3 and the end terminals 4 and 5, the end terminals may be maintained at a constant temperature and the intermediate one may be reduced in temperature.

The N-type thermoelectric material according to the instant invention consists principally of bismuth telluride in which the bismuth and tellurium are in stoichiometric proportions. A slight excess of bismuth renders this compound of P-type conductivity, whereas a slight excess of tellurium renders the compound of N-type conductivity. Although it is within the scope of the instant invention to include a slight excess of tellurium (up to 1.32 wgt. percent excess tellurium over the total weight of the tellurium), it is preferred to add other impurities to $Bi_2Te_3$ to obtain the significantly better thermoelectric properties of the alloy of the invention. For example, $Bi_2Te_3$ with a slight excess of tellurium has a thermoelectric power ($e$) of −155 microvolts/° C. and a resistivity of .0009 ohm cm. It is known that other impurities may be added to thermoelectric materials such as bismuth telluride to reduce the electrical resistivity. Such additions or impurities may be copper or silver for example. In general, however, while the resistivity is lowered, the thermoelectric power ($e$) is adversely affected. Furthermore, it was found that in attempting to introduce copper or silver additives to $Bi_2Te_3$ very little of the impurity would diffuse into the crystal lattice, the material being only surface "doped" as it were. According to the invention, the sulfides or selenides of copper and silver have been found to not only diffuse readily into the crystal lattice of bismuth telluride, but unexpectedly result in an alloy having low resistivity, a much higher E.M.F. and a very low deviation from the W.-F.-L. figure.

The impurities which may be alloyed with bismuth telluride according to the instant invention to achieve these results are CuS, $Cu_2S$, CuSe, $Cu_2Se$, $Ag_2S$ and $Ag_2Se$ in an amount up to about 1.64 wgt. percent based on the total weight of the bismuth telluride. The additive may consist entirely of any one of these materials or any combination thereof. The total additive, however, should not exceed 1.64 wgt. percent. It was found that at least about .82 wgt. percent impurity was the minimum required to appreciably improve the thermoelectric properties of the bismuth telluride. While additions exceeding the maximum percentage (1.64%) do result in an increase in the thermal E.M.F., there is a corresponding increase in the electrical resistivity.

The preferred alloy consists of equal parts of CuS and $Cu_2S$ with the total percentage of the impurities being, 1.24 wgt. percent. An alloy thus prepared having this composition has a thermal E.M.F. of −180 to −200 microvolts/° C., a resistivity of about .0006 to .0008 ohm cm, and a deviation from the W.-F.-L. ideal of less than three (or a W.-F.-L. number of less than $7.35 \times 10^{-8}$ volts$^2$/degree$^2$). When used with a comparable P-type material (such as the one described previously) a lowering of temperature of 52° C. is obtained.

The alloys of the invention are prepared by melting the appropriate amounts of bismuth and tellurium to form the compound $Bi_2Te_3$ together with the sulfide or selenide combinations as desired of silver or copper. Thereafter the alloy is allowed to cool slowly. The preferred alloy of the invention was prepared by melting the following constituents:

| | G. | Wgt. Percent |
|---|---|---|
| Bi | 12.54 | 51.45 |
| Te | 11.53 | 47.31 |
| CuS | 0.15 | 0.62 } 1.24 |
| $Cu_2S$ | 0.15 | 0.62 } |

This percentage of tellurium will provide about 0.44 wgt. percent excess tellurium compared to the total tellurium.

The weight-percentages of the copper sulfides are based upon the total weight of $Bi_2Te_3$. To illustrate the freedom in choice of additives according to the invention, 0.3 g. (or 1.24 wgt. percent) of either CuS or $Cu_2S$ may be employed instead of the CuS—$Cu_2S$ mixture indicated. Likewise, 0.15 g. CuSe and 0.15 g. $Cu_2Se$ or 0.3 g. of either may be employed. Furthermore, $Ag_2S$ or $Ag_2Se$ may be substituted for any of the copper sulfides or selenides in any of these examples.

There have thus been described improved thermoelectric materials of novel compositions which possess exceptionally advantageous thermoelectric properties and relatively great physical strength, which alloys are easily and simply prepared.

What is claimed is:

1. A thermoelectric alloy consisting essentially of $Bi_2Te_3$ alloyed with from 0.82% by weight to 1.64% by weight of at least one other compound selected from the group consisting of CuS, $Cu_2S$, $Ag_2S$, CuSe, $Cu_2Se$ and $Ag_2Se$.

2. A thermoelectric alloy consisting essentially of $Bi_2Te_3$ alloyed with 1.24% by weight of a compound selected from the group consisting of CuS, $Cu_2S$, $Ag_2S$, CuSe, $Cu_2Se$ and $Ag_2Se$.

3. A thermoelectric alloy consisting essentially of $Bi_2Te_3$ alloyed with about 1.24% by weight copper sulfide.

4. A thermoelectric alloy consisting essentially of $Bi_2Te_3$ alloyed with: from 0.41 to 0.82% by weight of a first compound selected from the group consisting of CuS, CuSe; and from 0.41 to 0.82% by weight of a second compound selected from the group consisting of $Cu_2S$, $Ag_2S$, $Cu_2Se$, and $Ag_2Se$.

5. A thermoelectric alloy consisting essentially of $Bi_2Te_3$, alloyed with: 0.62% by weight of a first compound selected from the group consisting of CuS, CuSe; and 0.62% by weight of a second compound selected from the group consisting of $Cu_2S$, $Ag_2S$, $Cu_2Se$, and $Ag_2Se$.

6. A thermoelectric alloy consisting essentially of $Bi_2Te_3$ alloyed with about 0.62% by weight CuS and 0.62% by weight $Cu_2S$.

7. A thermoelectric element comprising two circuit members of thermoelectrically complementary materials, said members being conductively joined to form a thermoelectric junction, at least one of said two members consisting of an alloy of $Bi_2Te_3$ with from 0.82% by weight to 1.64% by weight of at least one compound selected from the group consisting of CuS, $Cu_2S$, $Ag_2S$, $Cu_2Se$, and $Ag_2Se$.

8. The invention according to claim 7 wherein said alloy consists of $Bi_2Te_3$ with 1.24% by weight copper sulfide.

9. A thermoelectric element comprising two circuit members of thermoelectrically complementary materials, said members being conductively joined to form a thermoelectric junction, at least one of said two members consisting of an alloy of $Bi_2Te_3$ with 0.41% by weight to 0.82% by weight of a first compound selected from the group consisting of CuS, CuSe, and 0.41% by weight to 0.82% by weight of a second compound selected from the group consisting of $Cu_2S$, $Ag_2S$, $Cu_2Se$, and $Ag_2Se$.

10. The invention according to claim 9 wherein said alloy consists of $Bi_2Te_3$ with 0.62% by weight CuS and 0.62% by weight $Cu_2S$.

11. A thermoelectric element comprising two circuit members of thermoelectrically complementary materials, said members being conductively joined to form a thermoelectric junction, one of said two members consisting of an alloy of $Bi_2Te_3$ with 0.82% by weight to 1.64% by weight of at least one compound selected from the group consisting of CuS, CuSe, $Cu_2S$, $Ag_2S$, $Cu_2Se$ and $Ag_2Se$ and other of said members consisting of an alloy of from 17 to 32 mol percent Bi, 55 to 65 mol percent Te and 8 to 23 mol percent Sb.

12. A thermoelectric element comprising two circuit members of thermoelectrically complementary materials, said members being conductively joined to form a thermoelectric junction, one of said two members consisting of an alloy of $Bi_2Te_3$ with 0.82% by weight to 1.64% by weight of at least one compound selected from a group consisting of CuS, CuSe, $Cu_2S$, $Ag_2S$, $Cu_2Se$, $Ag_2Se$ and the other of said members consisting of an alloy of 60 mol percent Te, 20 mol percent Bi, 20 mol percent Sb, and 0.28% by weight silver and 0.56% by weight selenium the weight percentages of said silver and selenium being based on the total weight of said Te, Bi and Sb.

13. A thermoelectric element comprising two circuit members of thermoelectrically complementary materials said members being conductively joined to form a thermoelectric junction, one of said two members consisting of an alloy of $Bi_2Te_3$ with 0.82% by weight to 1.64% by weight of copper sulfide, and the other of said two members consisting of an alloy of 17 to 32 mol percent Bi, 55 to 65 mol percent Te, and 8 to 23 mol percent Sb.

14. The invention according to claim 13 wherein said first one of said two members consists of an alloy of $Bi_2Te_3$ with 0.62% by weight CuS and 0.62% by weight $Cu_2S$ and the second of said two members consists of an alloy of 60 mol percent Te, 20 mol percent Bi, 20 mol percent Sb, 0.28% by weight Ag and 0.56% by weight Se, said weight percentages being based on the total weight of Te, Bi and Sb.

15. A thermoelectric alloy consisting essentially of $Bi_2Te_3$ having a slight excess of tellurium and alloyed with from 0.82% by weight to 1.64% by weight of at least one compound selected from the group consisting of CuS, $Cu_2S$, $Ag_2S$, CuSe, $Cu_2Se$ and $Ag_2Se$, the excess of said tellurium being up to 1.32 weight percent based on the total weight of tellurium.

16. A thermoelectric element comprising two circuit members of thermoelectrically complementary materials, said members being conductively joined to form a thermoelectric junction, one of said two members consisting essentially of an alloy of $Bi_2Te_3$ with from 0.82% by weight to 1.64% by weight of at least one compound selected from the group consisting of CuS, CuSe, $Cu_2S$, $Ag_2S$, $Cu_2Se$ and $Ag_2Se$ and the other of said members consisting essentially of an alloy of from 17 to 32 mol percent Bi, 55 to 65 mol percent Te, 8 to 23 mol percent Sb and 0 to 0.56% by weight of at least one of Ag, Hg and Au and 0 to 1.7% by weight of at least one of Se and S, said last weight percentages based on the total weight of Te, Bi and Sb.

17. A thermoelectric element comprising two circuit members of thermoelectrically complementary materials, said members being conductively joined to form a thermoelectric junction, one of said two members consisting essentially of an alloy of $Bi_2Te_3$ with about 0.62% by weight CuS and 0.62% by weight $Cu_2S$ and the other of said members consisting essentially of an alloy of from 17 to 32 mol percent Bi, 55 to 65 mol percent Te, 8 to 23 mol percent Sb and 0 to 0.56% by weight of at least one of Ag, Hg and Au and 0 to 1.7% by weight of at least one of Se and S, said last weight percentages based on the total weight of Te, Bi and Sb.

18. The alloy of claim 1 wherein said other compound is copper sulfide.

19. The alloy of claim 4 wherein said first compound is CuS and said second compound is $Cu_2S$.

References Cited in the file of this patent

UNITED STATES PATENTS

| | | |
|---|---|---|
| 775,188 | Lyons et al. | Nov. 15, 1904 |
| 2,049,443 | Hermann | Aug. 4, 1936 |
| 2,543,331 | Okolicsanyi | Feb. 27, 1951 |
| 2,668,109 | Croft | Feb. 2, 1954 |
| 2,685,608 | Justi | Aug. 3, 1954 |
| 2,762,857 | Lindenblad | Sept. 11, 1956 |

OTHER REFERENCES

British Journal of Applied Physics, vol. 5, No. 11, November 1954, page 390.

Kältetechnik, vol. 5, No. 6, June 1953, page 155.